(12) United States Patent
Kim et al.

(10) Patent No.: US 6,660,652 B2
(45) Date of Patent: Dec. 9, 2003

(54) METHOD FOR FABRICATING SEMICONDUCTOR DEVICE

(75) Inventors: Jeong Ho Kim, Kyoungki-do (KR); Yu Chang Kim, Kyoungki-do (KR)

(73) Assignee: Hyundai Electronics Industries Co., Ltd., Kyungki-do (KR)

( * ) Notice: Subject to any disclaimer, the term of this patent is extended or adjusted under 35 U.S.C. 154(b) by 517 days.

(21) Appl. No.: 09/745,429

(22) Filed: Dec. 26, 2000

(65) Prior Publication Data
US 2001/0005637 A1 Jun. 28, 2001

(30) Foreign Application Priority Data
Dec. 24, 1999 (KR) .............................................. 99-61852

(51) Int. Cl.$^7$ ............................................. H01L 21/302
(52) U.S. Cl. ...................... 438/734; 438/714; 438/740; 438/750; 438/751; 438/723; 438/724; 438/720; 438/254
(58) Field of Search ................................. 438/734, 714, 438/740, 750, 751, 723, 743, 720, 254

(56) References Cited

U.S. PATENT DOCUMENTS 5,292,677 A * 3/1994 Dennison ..................... 437/52
6,010,931 A * 1/2000 Sun et al. ................... 438/240

* cited by examiner

Primary Examiner—George Goudreau
(74) Attorney, Agent, or Firm—Pillsbury Winthrop LLP

(57) ABSTRACT

The present invention discloses a method for fabricating a semiconductor device. In a process for forming metal interconnection contact holes on both a gate electrode including an Si-rich SiON film as a mask insulating film in a peripheral circuit region and on a semiconductor substrate, the metal interconnection contact hole is formed according to a three-step etching process using a photoresist film pattern exposing the intended locations of a metal interconnection contacts as an etching mask. Accordingly, contact properties are improved by preventing damage to the semiconductor substrate, thereby reducing leakage current and improving yield.

11 Claims, 6 Drawing Sheets

METHOD FOR FABRICATING SEMICONDUCTOR DEVICE

BACKGROUND OF THE INVENTION

1. Field of the Invention

The present invention relates to a method for fabricating a semiconductor device and, in particular, to a method for forming a metal interconnection contact hole in a peripheral circuit region, without damaging the semiconductor substrate.

2. Description of the Background Art

In general, the metal interconnection contacts on a DRAM are formed to at least the substrate in active regions, the gate electrodes, the bit lines and the capacitor plate electrodes. In highly integrated devices, the aspect ratio of a metal interconnection contact hole is typically greater than 10. Therefore, the metal interconnection contact hole is formed when a selection ratio to a deep ultraviolet (DUV) photoresist film used to form the contact pattern is at least 8 in an oxide film etching process. An etching process for forming the contact hole is performed in a reactive ion etch (RIE) system having an intermediate plasma density using a perfluorocarbon containing gas mixture such as $C_4F_8$ and Ar, $C_4F_6$ and Ar, or $C_5F_8$ and Ar.

In a high density plasma system, the selection ratio to the photoresist film is more typically 3 or 4. Accordingly, such systems are not suitable as the etch system for forming the metal interconnection contact holes.

In a conventional method for forming the metal interconnection contact hole, a mask insulating film of the gate electrode or bit line is an oxide film, and thus the etching process can be performed by using gas combinations and parameter that will generate a large amount of polymers, such as $C_4F_8$ and Ar.

However, when the mask insulating film of the gate electrode or bit line consists of an SiN or SiON film, a multi-step etching process is required.

A first etching process is performed onto the upper portion of the gate electrode using an etching gas such as a mixture of $C_4F_8$ and Ar, in order to obtain a high selection ratio to the photoresist film. A second etching process is then performed on the SiN or SiON film, by employing a mixed gas of $CHF_3$, Ar and $O_2$ or a mixed gas of $CF_4$, Ar and $O_2$, both of which provide better selectivity to the photoresist film.

The semiconductor substrate may be damaged in the two-step etching process. Because the wells of highly integrated devices are shallow, damage to the semiconductor substrate tends to increase contact resistance remarkably. Therefore, the etching process for forming the metal interconnection contact must be generally carried out by using the mixed gas of $CHF_3$, Ar and $O_2$ as the etching gas to obtain the high selection ratio with respect to the semiconductor substrate. In addition, when the mask insulating film is a SiN film, the etching process can be performed by using the mixed gas of $CHF_3$, Ar and $O_2$.

However, when that the mask insulating film is a SiON film, its etching properties vary according to film composition. The general SiON film consists of $Si_3N_4$ film and $SiO_3$ film, and thus can be etched by using the mixed gas of $CHF_3$, Ar and $O_2$. However, when the Si-rich SiON (SRON) film is used as an etch barrier film in the etching process according to a self aligned contact (SAC) method for a bit line contact and storage electrode contact, it is very difficult to etch the metal interconnection contact.

The SAC method employing the general SiN film has disadvantages in that transistor properties may be deteriorated due to the high stress within SiN film, tending to lift the gate electrode or bit line, increasing contact junction leakage current. Further, and additional reflection barrier film process is required in the formation of the photoresist film for the gate electrode or bit line.

In order to overcome such disadvantages, the SiN film is typically replaced by the $SiO_2$ film or SiON film. However, when the $SiO_2$ film or SiON film is used, the SAC process for forming the contacts to the bit line and storage electrode cannot be performed with acceptable margins.

Moreover, it is almost impossible to obtain a high selection ratio with respect to both the SiON film and the $SiO_2$ film in the oxide film etching process. Accordingly, because silicon is affected by different etch chemistry than that used to etch the oxide film when Si is added to the SiON to form a Si-rich SiON film, it is possible to obtain an improved etching selection ratio in the oxide etching process.

Thus, the Si-rich SiON film has been utilized as an etch barrier film for the SAC process for forming the bit line contact and storage electrode contact. However, the Si-rich SiON film has the disadvantage when it is used in the metal interconnection contact etching process in that it is generally etched using the mixed gas of $CHF_3$, Ar and $O_2$ or a mixed gas of $CF_4$, Ar and $O_2$. Here, the Si-rich SiON film is etched by using the mixed gas of $CHF_3$, Ar and $O_2$ with a large amount of $O_2$ included to maintain the selection ratio with respect to the photoresist film.

The semiconductor substrate will, however, be damaged by etch chemistry having large amounts of $O_2$. Especially, in the chemical mechanical polishing (CMP) process, the non-uniformity of the insulating films that must be opened to form the metal interconnection contact can be over 2000 Å. As a result, it is difficult to apply a three-step etching process including 1) a high selective etching process for the photoresist film, 2) an etching process for the Si-rich SiON film, and 3) a highly selective etching process for the semiconductor substrate, instead of the two-step etching process.

SUMMARY OF THE INVENTION

Accordingly, it is an object of the present invention to provide a method for fabricating a semiconductor device which can form a metal interconnection contact hole by performing a first etching process for removing an interlayer insulating film using a photoresist film pattern as an etch mask, a second etching process for removing an etch barrier film and a mask insulating film, and a third etching process for exposing the semiconductor substrate in the contact areas.

In order to achieve the above-described object of the present invention, in a method for fabricating a semiconductor device for forming a metal interconnection contact hole exposing a gate electrode in a peripheral circuit region of a semiconductor substrate and a presumed portion of a metal interconnection contact on the semiconductor substrate, a method for fabricating a semiconductor device includes the steps of: forming a MOSFET having the gate electrode and source/drain regions on the semiconductor substrate, a mask insulating film pattern being provided at the upper portion of the gate electrode, an insulating film spacer being provided at the side walls of the gate electrode; forming a first interlayer insulating film having a contact plug contacted with a presumed portion of a bit line contact and a storage electrode contact on the semiconductor substrate, and an etch barrier film over the entire structure;

forming a bit line and a capacitor contacted with the contact plug, and a second interlayer insulating film; forming a photoresist film pattern exposing a presumed portion of the metal interconnection contact on the second interlayer insulating film over the entire structure; and forming the metal interconnection contact hole by etching the stacked structure of the second interlayer insulating film, the etch barrier film and the mask insulating film pattern, and the stacked structure of the etch barrier film and the first interlayer insulating film according to a three-step etching process, by employing the photoresist film pattern as an etching mask, and removing the photoresist film pattern.

BRIEF DESCRIPTION OF THE DRAWINGS

The present invention will become better understood with reference to the accompanying drawings which are given only by way of illustration and thus should not be considered to unecessarily limit the present invention as defined by the claims.

DETAILED DESCRIPTION OF THE PREFERRED EMBODIMENTS

Figure 1A:
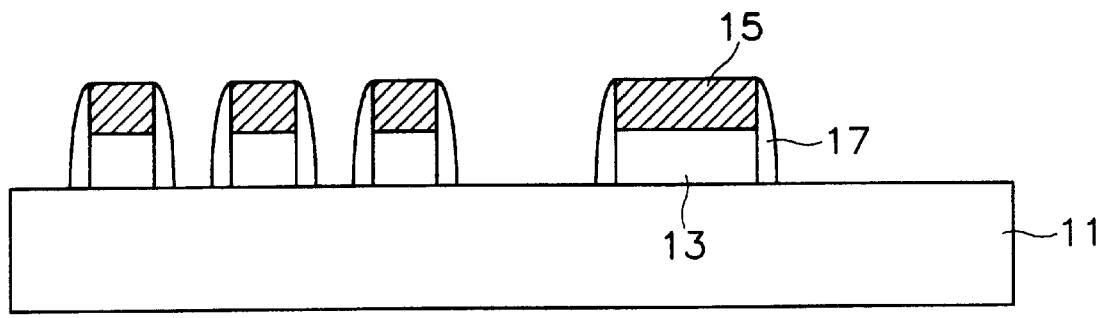
FIGS. 1A through 1I are cross-sectional diagrams illustrating sequential steps of a method for fabricating a semiconductor device in accordance with the present invention.

As illustrated in FIG. 1A, a device isolating film (not shown) is formed and etched to define active regions and device isolating regions on a semiconductor substrate 11. A gate insulating film (not shown) is formed over the entire structure.

A stacked structure of a gate electrode conductive layer (not shown) and a first mask insulating film (not shown) is formed on the gate insulating film in the active regions.

Thereafter, a gate electrode 13 and a first mask insulating film pattern 15 are formed by patterning and etching the stacked structure using a gate electrode mask as an etching mask and a mixed gas of $CF_4$, Ar and $O_2$ or a mixed gas of $CHF_3$, Ar and $O_2$ as the etching gas. Here, the first mask insulating film pattern 15 consists of an Si-rich SiON film (SRON).

A nitride film is then formed over the entire structure.

A nitride film spacer 17 is formed at the sidewalls of the gate electrode 13 and the first mask insulting film pattern 15 by etching the nitride film.

Source/drain regions (not shown) are then formed by implanting an impurity in to the semiconductor substrate 11 at both sides of the nitride film spacer 17. The source/drain regions may have a lightly doped drain (LDD) structure.

Figure 1B:
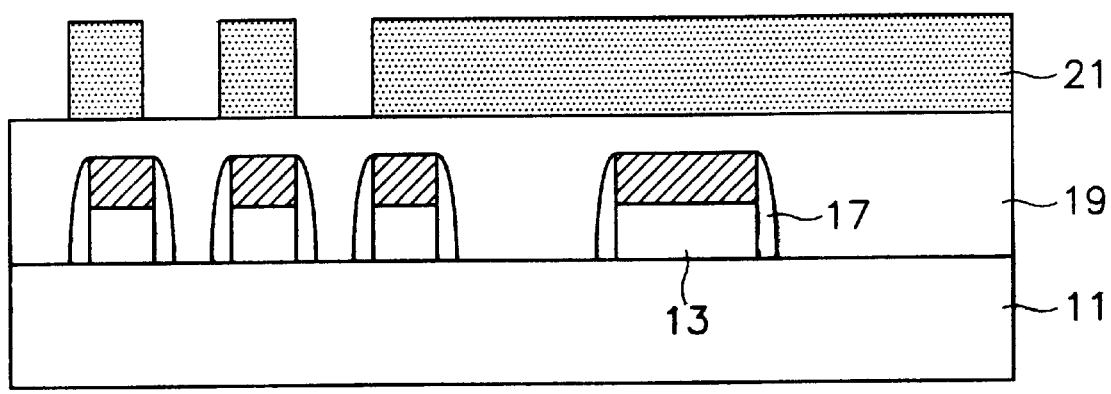

Referring to FIG. 1B, a first interlayer insulating film 19 is formed over the entire structure. Here, the first interlayer insulating film 19 consists of an oxide film having an etching selection ratio difference from the nitride film spacer 17 and the first mask insulating film pattern 15.

Thereafter, a first photoresist film pattern 21 that exposes the insulating film 19 where the bit line contacts and storage electrode contacts are to be formed on the semiconductor substrate 11 is formed on the first interlayer insulating film 19.

Figure 1C:
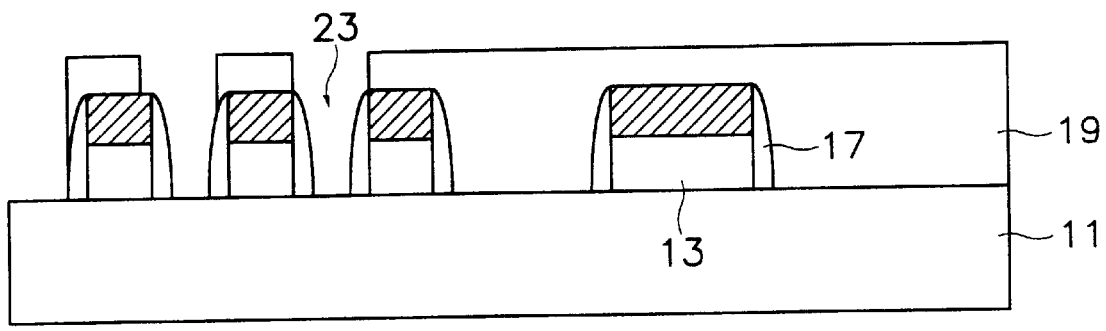

As depicted in FIG. 1C, the first interlayer insulating film 19 is removed according to an etching process employing the first photoresist film pattern 21 as an etching mask, thereby forming a first storage contact hole 23 exposing the intended portion of the bit line contact and the storage electrode contact.

In order to provide a highly selective etching process for the first mask insulating film pattern 15 and the nitride film spacer 17, the etching process is performed using a perfluorocarbon containing gas that generates a large amount of polymers, such as $C_2F_6$, $C_2F_4$, $C_3F_6$, $C_3F_8$, $C_4F_6$, $C_4F_8$, $C_5F_8$, $C_5F_{10}$ or $C_2HF_5$.

The etching process may be carried out by using a mixed gas comprising a perfluorocarbon containing gas and a hydrogen containing gas, such as $CHF_3$, $CH_3F$, $CH_2F_2$, $CH_2$, $CH_4$, $C_2H_4$ or $H_2$.

In addition, the etching process may be performed by adding an inert gas such as He, Ne, Ar or Xe to the perfluorocarbon containing gas or to a mixed gas of the perfluorocarbon containing gas and the hydrogen containing gas, thereby overcoming an etch stop phenomenon by improving plasma stability and sputtering effects, and performing a reproducible etching process.

The etching process employs CxHyFz gas ($x \geq 2$, $y \geq 2$, $z \geq 2$) as an etching gas, and thus obtains a high etching selection ratio to the mask insulating film pattern and the insulating film spacer. On the other hand, the etching process may be performed by using a mixed gas of the CxHyFz gas ($x \geq 2$, $y \geq 2$, $z \geq 2$) and the inert gas as an etching gas.

The first photoresist film pattern 21 is then removed.

Figure 1D:
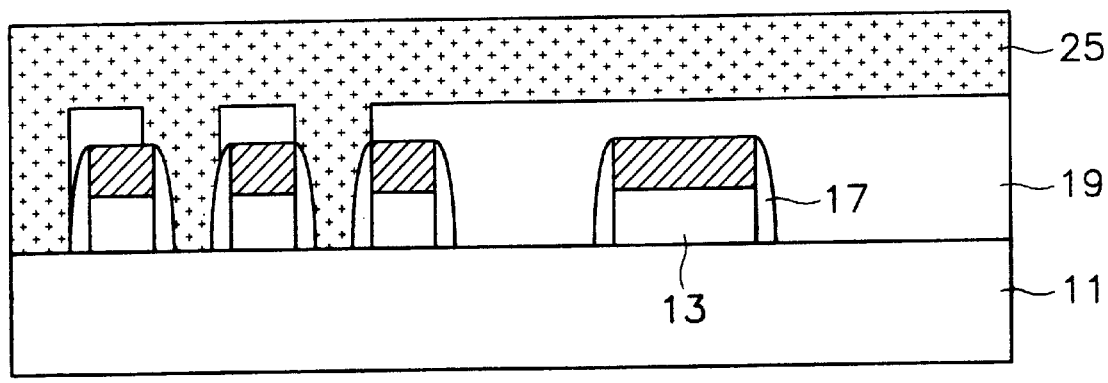

As shown in FIG. 1D, a conductive layer 25 for a first contact plug is then formed over the entire structure.

Figure 1E:
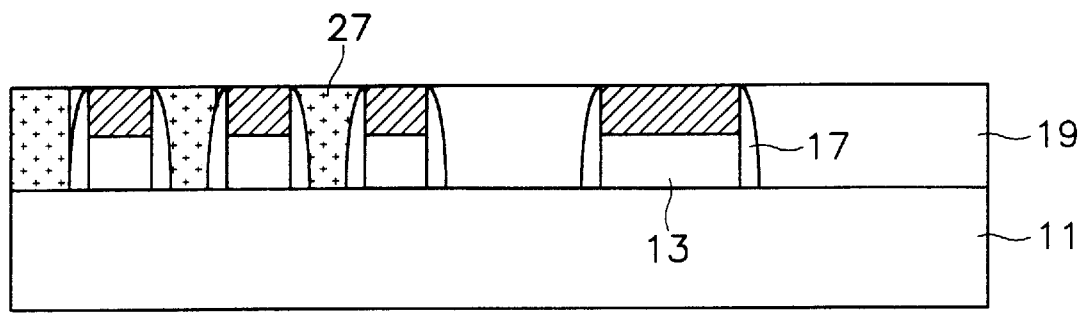

As illustrated in FIG. 1E, the first contact plug 27 is formed by removing the remainder of the conductive layer 25 with a chemical mechanical polishing (CMP) process. The CMP process employs the first mask insulating film pattern 15 as an end point indicator.

Figure 1F:
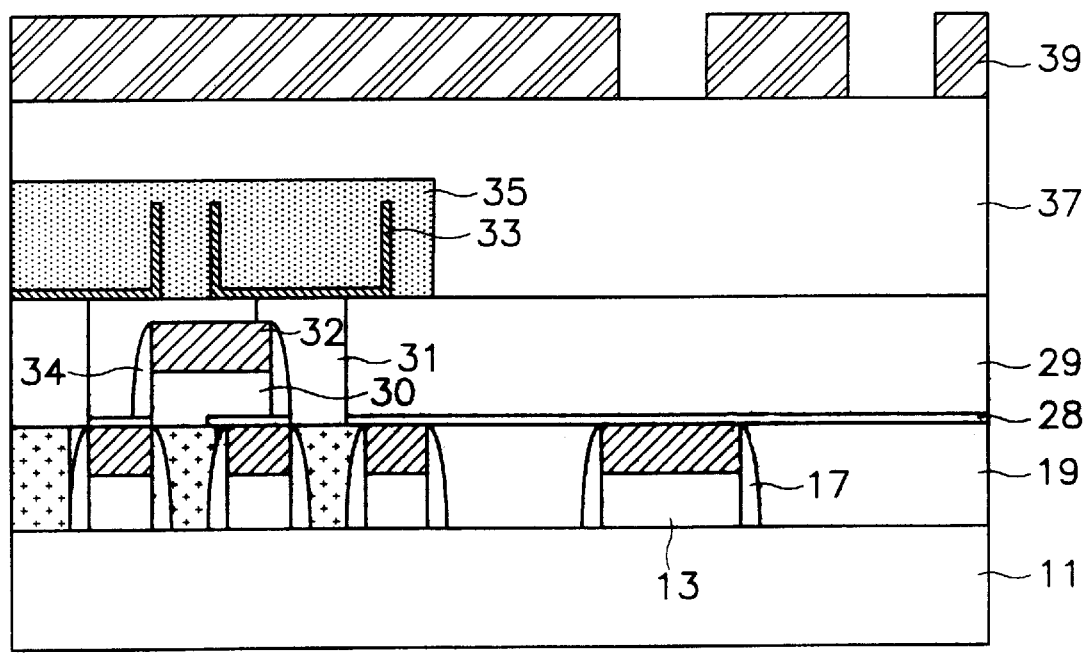

As depicted in FIG. 1F, an etch barrier film 28 is formed over the entire structure by using an SiN or SiON film. The intended location of the bit line contact is exposed in the first contact plug 27.

Thereafter, a bit line 30 is formed in contact with the first contact plug 27. Here, a second mask insulating film pattern 32 is provided at the upper portion of the bit line 30, and a second insulating film spacer 34 is provided at the sidewalls of the stacked structure.

A second interlayer insulating film 29 is then formed over the entire structure.

The second interlayer insulating film 29 is etched by using a contact mask that exposing the intended location for the storage electrode contact in the first contact plug 27, thereby forming a contact hole. When forming the contact hole, the etch barrier film 28 formed on the first contact plug 27 is removed.

A second contact plug 31 is formed in contact with the first contact plug through the contact hole.

A storage electrode 33 is then formed in contact with the second contact plug 31.

Thereafter, a dielectric film (not shown) and a plate electrode 35 are formed over the entire structure, thereby forming a capacitor in a cell region of the semiconductor substrate 11.

A third interlayer insulating film 37 is formed over the entire structure, and then planarized. A second photoresist film pattern 39 exposing a the intended location of a metal interconnection contact in a peripheral circuit region of the semiconductor substrate 11 is formed on the third interlayer insulating film 37.

Figure 1G:
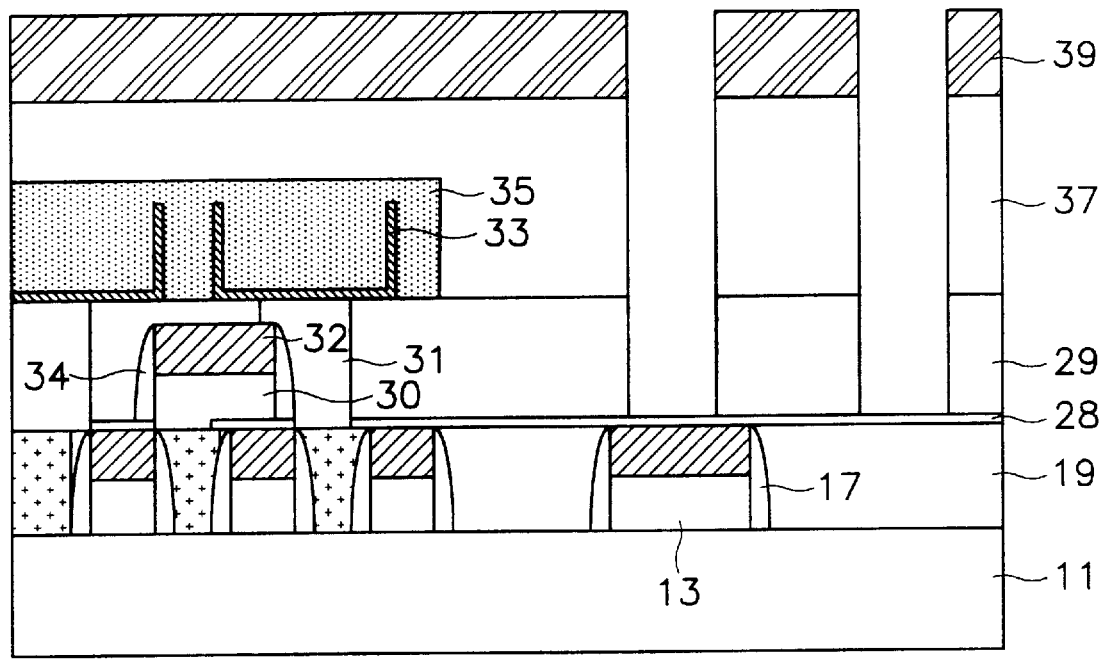
Figure 1H:
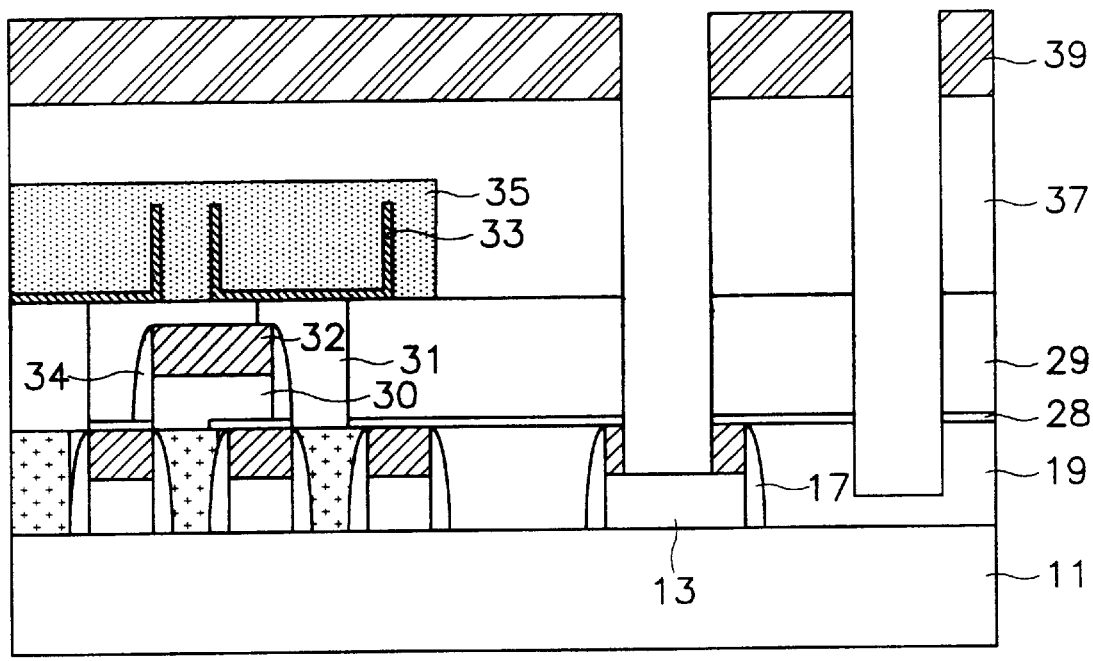
Figure 1I:
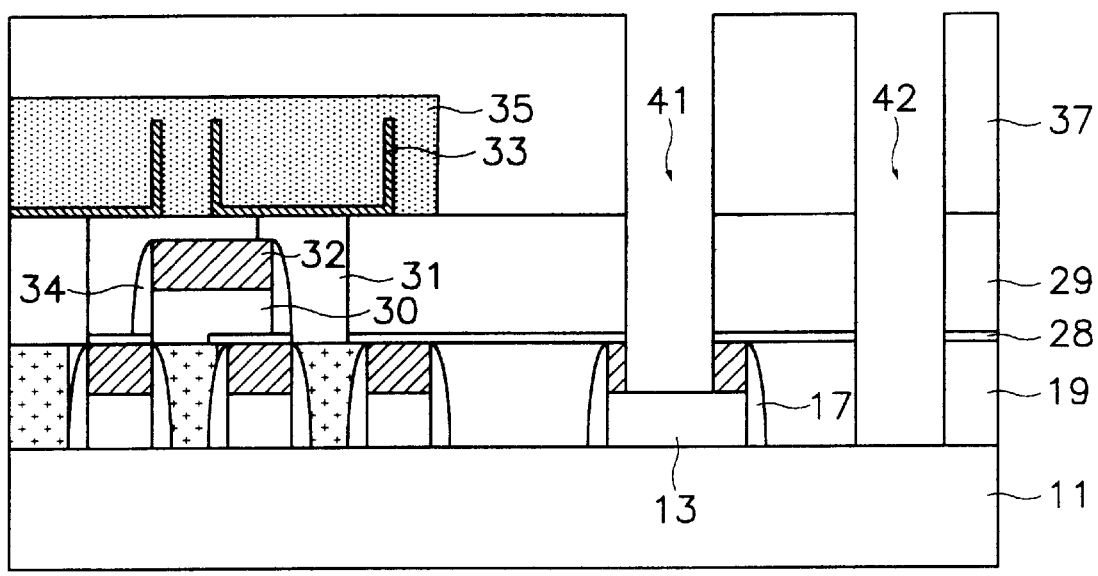

As illustrated in FIGS. 1G to 1I, a metal interconnection contact hole is then formed according to a three-step etching process using the second photoresist film pattern 39 as an etching mask.

Referring to FIG. 1G, a first etching process etches the third interlayer insulating film 37 and the second interlayer insulating film 29 using the second photoresist film pattern 39 as an etching mask. In the first etching process, the etch barrier film 28 is used as an etch barrier, and the perfluorocarbon containing gas generating a large amount of polymers and having a high etching selection ratio to the second photoresist film pattern 39 is used as an etching gas. In addition, the first etching process may be performed by utilizing a mixed gas of the perfluorocarbon containing gas and an oxygen containing gas as the etching gas.

As shown in FIG. 1H, a second etching process forms the metal interconnection contact hole 41 exposing the gate electrode 13, by removing the first mask insulating film pattern 15 on the gate electrode in the peripheral circuit region. Here, of a predetermined thickness the first interlayer insulating film 19 is removed in the region where the gate electrode 13 has not been formed.

The second etching process uses $CF_4$, $CHF_3$, $NF_3$ or $C_2F_6$ as a main etching gas. In addition, the second etching process may be performed by adding $CH_3F$, $CH_2F_2$ or $C_2HF_5$, an inert gas such as He, Ne, Ar or Xe, or an oxygen containing gas such as CO, $CO_2$ or $O_2$ to the main etching gas. Here, a large amount of $O_2$ gas is used. Since the etching selection ratio to the semiconductor substrate 11 is relatively low, the etch depth is controlled to avoid exposing the semiconductor substrate 11.

As depicted in FIG. 1I, a third etching process is then performed with a high etching selection ratio to the semiconductor substrate 11. In the third etching process, the mixed gas of the first etching process may again be used as the etching gas. The semiconductor substrate 11 is exposed by completely removing the remaining thickness the first interlayer insulating film 19 in the region where the gate electrode has not been formed, thereby forming a metal interconnection contact hole 42.

Although not illustrated, a metal interconnection with the gate electrode 13 and the semiconductor substrate 11 made through the metal interconnection contact holes 41, 42 is then formed by using a metal layer.

As discussed earlier, in accordance with the present invention, in the process for forming the metal interconnection contact hole on the gate electrode including the Si-rich SiON film as the mask insulating film in the peripheral circuit region and on the semiconductor substrate, the metal interconnection contact hole is formed according to the three-step etching process using the photoresist film pattern that exposes the intended locations of the metal interconnection contacts as an etching mask. Accordingly, contact properties are improved by preventing damage to the semiconductor substrate, leakage current is reduced, and device properties and yield are improved.

As the present invention may be embodied in several forms without departing from the spirit or essential characteristics thereof, it should also be understood that the above-described embodiment is not limited to the specific details provided in the foregoing description, unless otherwise specified, but rather should be construed broadly within its spirit and scope as defined in the appended claims. Therefore, all changes and modifications to the process that fall within the metes and bounds of the claims, or equivalences of such metes and bounds are therefore intended to be embraced by the appended claims.

What is claimed is:

1. A method for fabricating a semiconductor device for forming a metal interconnection contact hole exposing a gate electrode in a peripheral circuit region of a semiconductor substrate and a metal interconnection contact on the semiconductor substrate, a method for fabricating a semiconductor device comprising the steps of:
   forming a MOSFET having the gate electrode and source/drain regions on the semiconductor substrate, a mask insulating film pattern being provided at the upper portion of the gate electrode, and an insulating film spacer being provided at the side walls of the gate electrode;
   forming a first interlayer insulating film having therein a contact plug, the contact plug contacting a bit line contact and a storage electrode contact on the semiconductor substrate;
   forming an etch barrier film over the entire structure;
   forming a bit line and a capacitor in contact with the contact plug;
   forming a second interlayer insulating film over the entire structure;
   forming a photoresist film pattern exposing the intended locations of the metal interconnection contacts on the second interlayer insulating film; and
   forming the metal interconnection contact hole by etching the stacked structure of the second interlayer insulating film, the etch barrier film and the mask insulating film pattern, and the stacked structure of the etch barrier film and the first interlayer insulating film according to a three-step etching process, by employing the photoresist film pattern as an etching mask, and removing the photoresist film pattern.

2. The method according to claim 1, wherein the mask insulating film pattern consists of an Si-rich SiON film.

3. The method according to claim 1, wherein the etch barrier film consists of an SiN or SiON film.

4. The method according to claim 1, wherein the first interlayer insulating film and the second interlayer insulating film consist of an oxide film, the oxide film having an etching selection ratio to the etch barrier film of at least 8.

5. The method according to claim 1, wherein the three-step etching process comprises:
   a first etching process for removing the second interlayer insulating film by using the etch barrier film as an etch barrier;
   a second etching process for removing the etch barrier film on the gate electrode, the mask insulating film pattern, the etch barrier film on the semiconductor substrate and a predetermined thickness of the first interlayer insulating film; and
   a third etching process exposing the semiconductor substrate by removing the remainder of the first interlayer insulating film from the semiconductor substrate.

6. The method according to claim 5, wherein the first and third etching processes use an etching gas comprising a perfluorocarbon-containing gas that generates a large amount of polymers.

7. The method according to claim 6, wherein the perfluorocarbon-containing gas comprises one or more gases selected from the group consisting of $C_2F_6$, $C_2F_4$, $C_3F_6$, $C_3F_8$, $C_4F_6$, $C_4F_8$, $C_5F_8$, $C_5F_{10}$, $C_2HF_5$.

8. The method according to claim 7, wherein the first and third etching processes use a mixed gas of the perfluorocarbon-containing gas and an inert gas as the etching gas.

9. The method according to claim 5, wherein the first and third etching processes use a mixed gas comprising a perfluorocarbon-containing gas and a hydrogen-containing gas as the etching gas.

10. The method according to claim 5, wherein the second etching process is performed using $CF_4$, $CHF_3$, $NF_3$ or $C_2F_6$ as a main etching gas.

11. The method according to claim 5 or 10, wherein the second etching process is performed using an etching gas comprising the mixed gas, the mixed gas further comprising at least one gas among a gas selected from the group consisting of $CH_3F$, $CH_2F_2$ and $C_2HF_5$, an inert gas selected from the group consisting of He, Ne, Ar or Xe, and an oxygen-containing gas selected from the group consisting Of CO, $CO_2$ or $O_2$.

* * * * *